(12) United States Patent
Grasset et al.

(10) Patent No.: US 7,227,412 B2
(45) Date of Patent: Jun. 5, 2007

(54) ATTENUATION CELL WITH AN ATTENUATION FACTOR CONTROL DEVICE

(75) Inventors: Jean-Charles Grasset, Moirans (FR); Frédéric Bossu, San Diego, CA (US)

(73) Assignee: STMicroelectronics S.A., Montrouge (FR)

( * ) Notice: Subject to any disclaimer, the term of this patent is extended or adjusted under 35 U.S.C. 154(b) by 51 days.

(21) Appl. No.: 11/025,848

(22) Filed: Dec. 29, 2004

(65) Prior Publication Data
US 2005/0195034 A1 Sep. 8, 2005

(30) Foreign Application Priority Data
Dec. 29, 2003 (FR) .................................. 03 15479

(51) Int. Cl.
*H03F 3/45* (2006.01)
(52) U.S. Cl. ...................... 330/254; 330/256; 327/356; 327/359
(58) Field of Classification Search ................ 330/254, 330/256; 327/356, 359
See application file for complete search history.

(56) References Cited

U.S. PATENT DOCUMENTS

| | | | |
|---|---|---|---|
| 5,757,230 A * | 5/1998 | Mangelsdorf ............... 330/133 |
| 6,084,471 A | 7/2000 | Ruth, Jr. et al. ............ 330/254 |
| 6,124,761 A * | 9/2000 | Robinson et al. ........... 330/254 |
| 6,215,989 B1 * | 4/2001 | Otaka ...................... 455/234.1 |
| 6,452,449 B1 * | 9/2002 | Saito .......................... 330/254 |
| 6,456,142 B1 * | 9/2002 | Gilbert ....................... 327/356 |
| 6,967,533 B2 * | 11/2005 | Vilhonen et al. ........... 330/254 |

* cited by examiner

*Primary Examiner*—Patricia Nguyen
(74) *Attorney, Agent, or Firm*—Lisa K. Jorgenson; Dennis M. de Guzman; Seed IP Law Group PLCC

(57) ABSTRACT

Attenuation cell comprising first and second differential pairs of bipolar transistors. A gain control device applies a voltage VA−VB between the bases of both differential pairs and comprises a set of three diodes in which a current IA, a current IB and the sum IA+IB of both preceding currents flow, respectively. The two diodes seeing current IB and IA+IB generate a voltage, respectively VB and VC, and the difference between these two voltages is used to generate a value Iz used in a control loop. A desired value Vct is transformed into information Ix, then into information Iy proportional to absolute temperature T, and an error amplifier uses information Iy−Iz and generates currents IA and IB by minimizing this difference.

15 Claims, 6 Drawing Sheets

ATTENUATION CELL WITH AN ATTENUATION FACTOR CONTROL DEVICE

BACKGROUND OF THE INVENTION

1. Field of the Invention

The present disclosure generally relates to analog signal processing circuits and in particular but not exclusively to an attenuation cell having an attenuation factor control device for applying dB-linear control according to a control value, voltage or current.

2. Description of the Related Art

Attenuation cells are frequently used in analog signal processing circuits. When associated with an amplifier, an attenuation cell makes it possible to obtain variable gain, as illustrated in FIG. 1 where a cell 1 is combined with an amplifier 2—of the transconductance type—which receives a differential input signal $V_{in}$. By varying the current circulating in the load, made up of two resistors 3 and 4, the gain of the whole circuit can be controlled.

In many applications, it is desirable to have gain that is linear with control, expressed directly in decibels from a desired input, current or voltage. In the most recent wireless telecommunication techniques, based on the Wideband Code Division Multiple Access (WCDMA) principle or on the Code Division Multiple Access (CDMA), the gain of internal circuits of a mobile telephone communicating with a base station is controlled with control data from the base station. The performances of the telephone depend directly on the precision with which the gain set by the base station can be controlled.

In wireless telephony applications, as well as in many other applications, it is desirable to be able to precisely control amplifier gain, such control being in addition independent of temperature and independent of the dispersion of the characteristics resulting from the manufacturing method. Under these conditions, calibration tasks and telephone development are greatly simplified.

Generally, in known circuits, the linear relation between gain, in decibels, and desired input is established by means of a second order approximation, which leads to very limited precision. With this technique, accuracy hardly ever exceeds 1%.

U.S. Pat. No. 6,084,471 entitled "SOFT-LIMITING CONTROL CIRCUIT FOR VARIABLE GAIN AMPLIFIER" by Robert N Ruth and al. describes an example of an amplifier gain control circuit based on a mechanism that is both analog and digital, using a digital signal processor.

U.S. Pat. No. 6,124,761 entitled "VARIABLE GAIN AMPLIFIER WITH GAIN LINEAR WITH CONTROL VOLTAGE" by Trevor Robinson et al. describes another known example of an attenuation cell based on the use of a diode through which flows a current in order to carry out linear gain control.

It is observed that known attenuation control cells are limited with regard to the precision of the attenuation factor, which also largely depends on operational temperature. It would be desirable to have an attenuation control cell allowing a high degree of accuracy on a broad temperature range, larger than 100 degrees Celsius, for example.

BRIEF SUMMARY OF THE INVENTION

One embodiment of the present invention provides an attenuation control cell allowing to precisely control a gain, expressed in decibel, from a desired input—input voltage or current.

The attenuation cell according to one embodiment of the invention comprises a first differential pair fed by a first power source and a second differential pair fed by a second power source. The input of the cell is composed, on the one hand, of the transmitters of the first pair in joint connection and, on the other hand, of the transmitters of the second differential pair in joint connection.

A gain control device applies a voltage VA−VB between the bases of the two differential pairs and comprises a set of three diodes in which a current IA, a current IB and the sum IA+IB of both preceding currents flow, respectively. The two diodes seeing current IB and IA+IB generate a voltage, respectively VB and VC, and the difference between these two voltages is used to generate a value Iz that is used in a control. Desired input Vct is transformed into information Ix, then into information Iy proportional to absolute temperature T, and an error amplifier uses information Iy−Iz and generates currents IA and IB by minimizing this difference.

More specifically, the gain control device of one embodiment comprises:

- a first diode seeing a current IA for generating a voltage difference controlling said voltage VA;
- a second diode seeing a current IB for generating a voltage difference controlling said voltage VB;
- a third diode seeing the sum IA+IB of the currents flowing through said first and second diodes generated by a power source for generating a voltage difference VC correspondent to the sum of currents IA+IB;
- an amplifier having two inputs connected respectively to voltages VB and VC generated by said second diode and said third diode, said amplifier generating information Iz representative of the difference between voltages VB and VC and proportional to the attenuation in dB;
- a converter circuit receiving a desired value Vct that varies linearly and generating a first intermediate electric value Ix;
- a multiplier circuit receiving said first intermediate value and generating a second value Iy proportional to said desired value Vct and to the absolute temperature T;
- an error amplifier receiving as input error Iy−Iz and generating currents IA and IB in order to minimize said error.

In one embodiment, information Ix Iy and Iz are differential currents and said error amplifier is a current amplifier.

In an embodiment, voltage tracker circuits are inserted between voltages VA and VB generated by the first and second diodes, and the bases of the two differential pairs of the attenuation cell. These voltage tracker circuits are provided to ensure insensitivity to the manufacturing method of the transistors' current gain, and to reach high levels of attenuation.

DETAILED DESCRIPTION

Embodiments of an attenuation cell with an attenuation factor control device are described herein. In the following description, numerous specific details are given to provide a thorough understanding of embodiments. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 2:
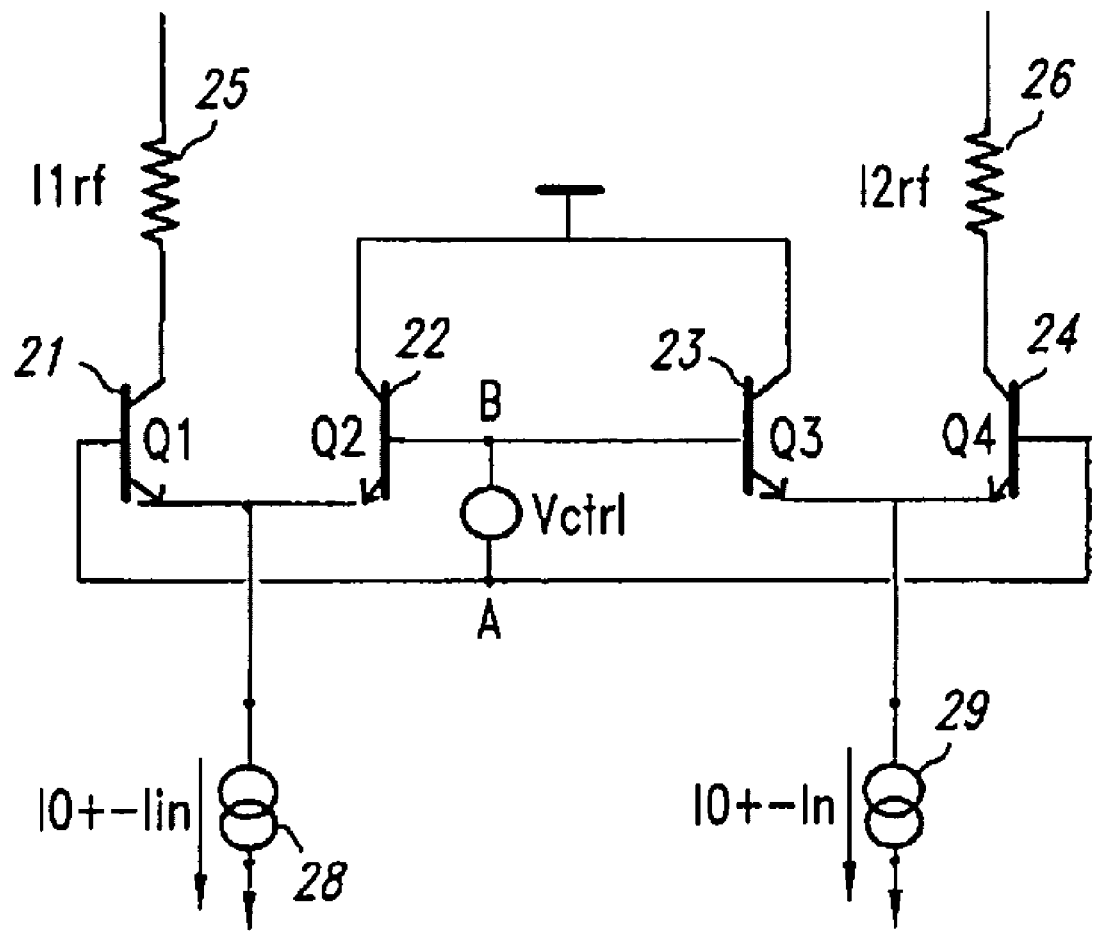
FIG. 2 illustrates the architecture of an attenuation cell to which the gain control device according to one embodiment of the invention can be applied.

FIG. 2 illustrates the architecture of an attenuation cell to which gain control according to one embodiment of the invention will be applied. This cell is composed of two differential pairs of bipolar transistors. The first pair comprises a first transistor Q1 21 and a second transistor Q2 22, while the second pair is composed of a third transistor Q3 23 and a fourth transistor Q4 24. The common mode electrode of the transmitter of each pair of transistors Q1–Q2 and Q3–Q4 is polarized by a polarization current $I_0$ supplied by a power source, respectively 28 and 29.

The bases of transistors Q1 and Q4 are connected together to the same voltage A and, similarly, the bases of transistors Q2 and Q3 are connected to the same voltage B. The voltage difference between points A and B is set by a control voltage Vctrl, which makes it possible to control the attenuation applied by the attenuation cell made up of both differential pairs Q1–Q2 and Q3–Q4. Generally, the attenuation cell comprises two input electrodes, which are composed, on one hand, of the common mode transmitter electrode of pair Q1–Q2 and, on the other hand, the common mode transmitter electrode of pair Q3–Q4. Transistor collectors Q1 and Q4 provide a first and a second output electrode of the attenuation cell, to which a first resistive load 25 and a second resistive load 26 will be connected, as can be seen in FIG. 2. More generally, inductive loads could also be considered.

Figure 1:
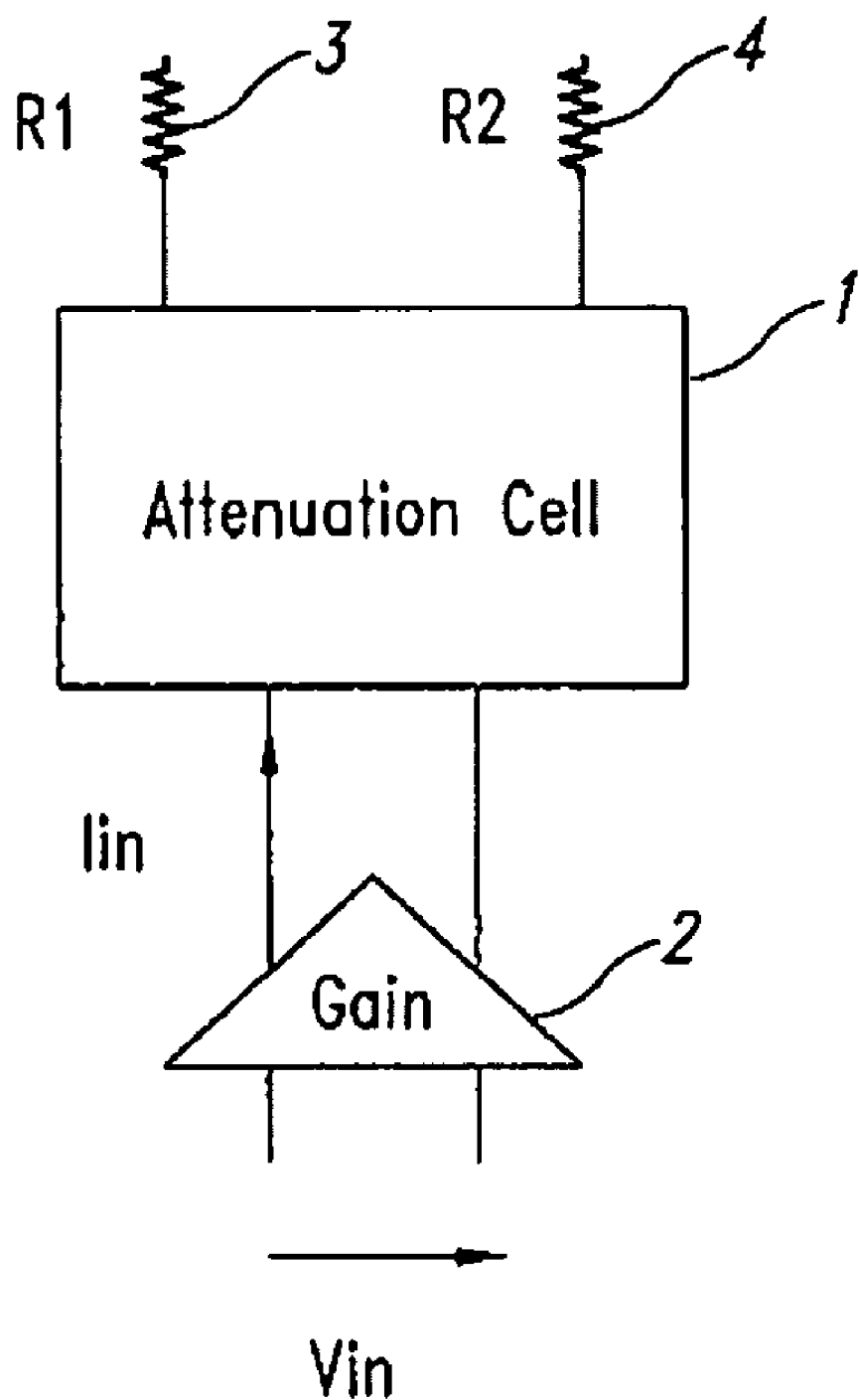
FIG. 1 illustrates a traditional diagram of an attenuation cell associated with an amplifier circuit making it possible to obtain variable gain.

Applying a differential voltage between the two bases of the attenuation cell creates a current derivation between the transmitters of both differential pairs Q1–Q2 and Q3–Q4, as illustrated in FIG. 2 by current source $I_{in}$. Current $I_{in}$ is the input current of the attenuation cell coming, for example, from a transconductance amplifier as illustrated in FIG. 1. $I_{in}$ is thus directed either completely to Q1 (respectively Q4), or completely to Q2 (respectively Q3), or partially in Q1 or Q2, ensuring various levels of attenuation for current I1rf (respectively I2rf).

If the collector current of transistor Q1 flowing through the first resistive load 25 is noted $I_{1rf}$ and the collector current of transistor Q4 flowing in the second resistive load 26 is denoted $I_{2rf}$, then the transfer function of the attenuation cell of FIG. 2 can be written as:

$$Ai(dB)=20. \log(i_{1rf}/I_{rf}) \quad (1)$$

It can be shown that the cell's attenuation factor, that will be represented by the generic expression of the gain (even when said gain is lower than 1), is a value which is directly homothetic to the ratio of the polarization currents of the transistors, which makes it possible to express the gain in decibels in the following form:

$$Ai(dB)=20 \log(I_{Q1}/I_0) \quad (2)$$

With $I_{Q1}$ representing the polarization current of transistor Q1.

It can thus be noted that if the totality of current $I_0$ goes through transistor Q1, then an attenuation factor of 0 dB is obtained and therefore maximum gain. If only half of current $I_0$ goes through transistor Q1, then the attenuation is –6 dB, which corresponds to a value of 0.5. It is thus clear that the attenuation of the attenuation cell is controlled by precisely setting the polarization current of transistor Q1 by means of a control voltage $V_{ctrl}$, the control mode of which will now be described.

Figure 3:
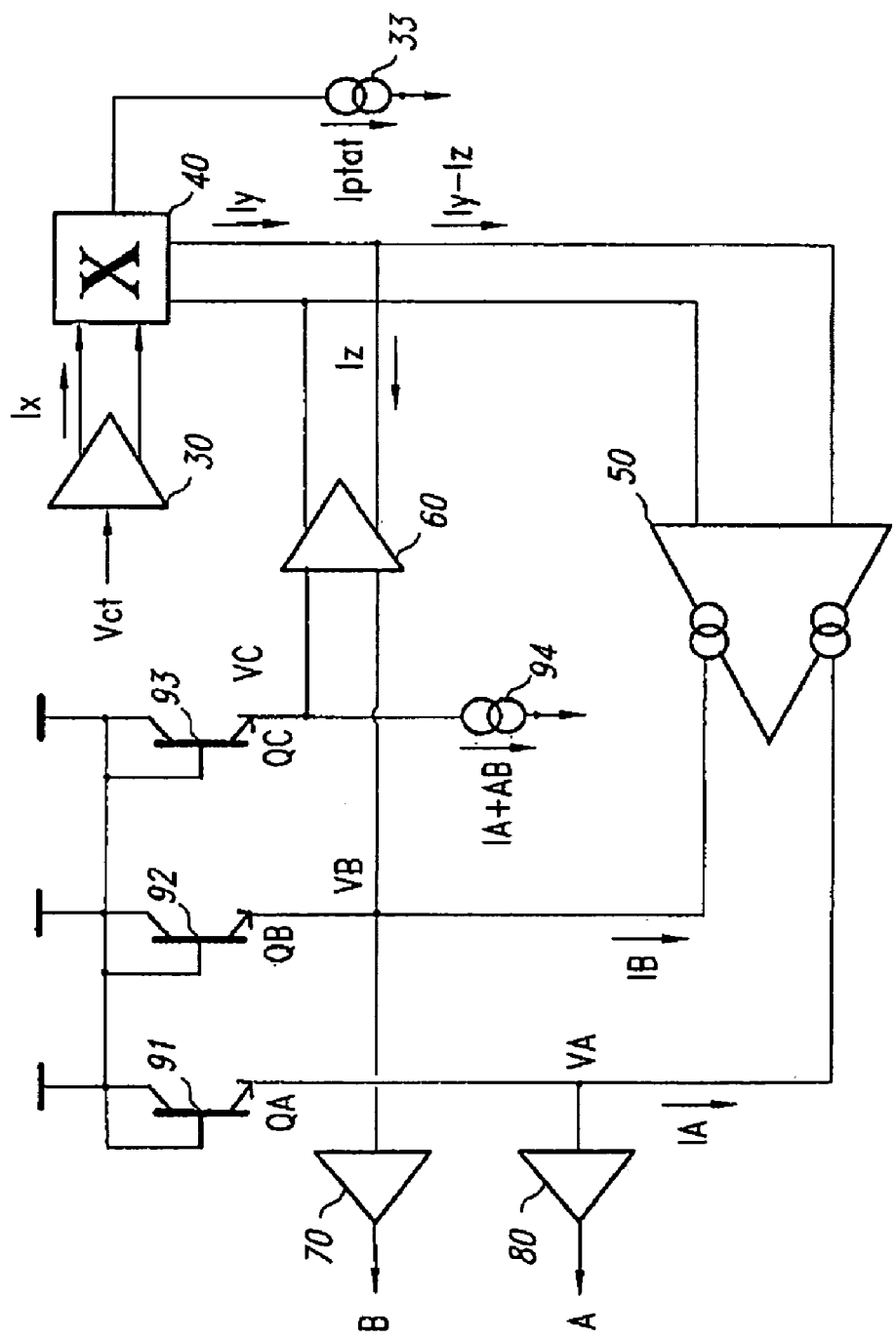
FIG. 3 illustrates one embodiment of the control device of the gain according to the invention.

FIG. 3 illustrates the control circuit of the attenuation factor of the cell depicted in FIG. 2, and in particular the generation of voltages A and B controlling the bases of transistors Q1–Q4 and Q2–Q3.

The control circuit comprises a converter circuit 30 receiving an analog desired value, for example a voltage or a current used to linearly control the attenuation factor of the cell.

In one embodiment, the desired value is a voltage Vct that the converter circuit 30 converts in the form of a differential current Ix.

Indeed, in an embodiment, all the electric values are converted into a differential current, which makes it possible to considerably simplify the design of the feedback circuit and, in addition, increases the precision of attenuation factor control.

The differential current Ix generated by circuit 30 is then transmitted to an analog multiplier 40, which multiplies the current Ix generated by amplifier 30 by a value $Ip_{tat}/I_0$ that is proportional to absolute temperature (PTAT). A resulting desired value Iy is generated which is directly proportional to the absolute temperature T (in Kelvin degrees) and which will be used in the control loop of the control circuit in order to ensure thermal insensitivity within a broad working temperature range.

Multiplier 40 outputs a differential desired current Iy proportional to absolute temperature, according to the following formula:

$$Iy=2.Ix.Ip_{tat}/I_0=2Ix/Io.K1.T/Rs$$

K1: design constant

T: absolute temperature in Kelvin.

Rs: resistance used to generate current $I_{ptat}$. This resistor is, in an embodiment, silicon integrated.

Figure 6:
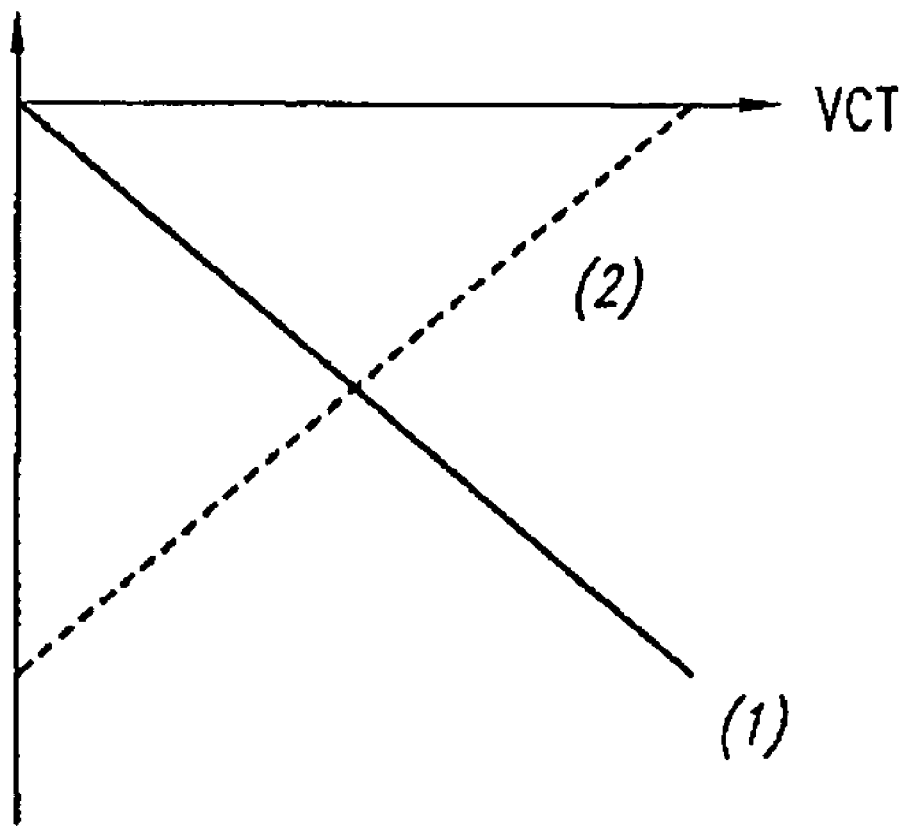
FIG. 6 illustrates an example linear characteristic obtained with the gain control of the attenuation cell.

The circuit further comprises a set of three transistors 91, 92 and 93 which are assembled as diodes and whose junctions n-p are used to generate a linear logarithmic conversion allowing linear control of the attenuation factor expressed in decibels, as represented in FIG. 6.

A first transistor 91, assembled as a diode, sees a current IA and has a transmitter electrode whose voltage VA is transmitted, via a voltage tracker 80, to potential A controlling the common bases of transistors Q1–Q4 of FIG. 2.

A second transistor 92, also mounted as a diode, sees a current IB and has a transmitter electrode whose voltage VB is transmitted, via voltage tracker 70, to potential B of the common bases of transistors Q2–Q3 of FIG. 2.

Elements 70 and 80 are used to ensure that the bases of transistors Q2–Q3 and Q1–Q4, respectively, do not disrupt the precision of the control mechanism of FIG. 3. This makes it possible to control high levels of attenuation.

Advantageously, a third bipolar transistor QC 93, also mounted as a diode, is finally installed, which sees the sum of currents IA+IB generated by a power source 94. The transmitter electrode of transistor 93 generates a voltage VC that is transmitted to a first input of an amplifier circuit 60 whose second input receives the voltage of transmitter of transistor QB 92. When considering the translinear loop composed of transistors 91 and 92 of FIG. 3, and transistors Q1–Q2 of FIG. 2, it is easy to demonstrate that:

$$Ai(dB)=20. \log(i_{1rf}/I_{rf})=20. \log(IB/(IA+IB))$$

Voltage difference VB–VC is thus directly transmitted to amplifier 60, sharply degenerated to ensure good linearity, and the transmitter voltages of transistors 91 and 93 are thus used in the control loop of the gain control circuit. Indeed, amplifier 60 receives these two voltages on both its inputs and generates a differential current Iz from the voltage difference between points B and C, which voltage, as can be seen in FIG. 3, is subtracted from the desired differential current Iy generated by multiplier 40.

Iz is a value proportional to the value of the attenuation in dB and can be expressed as follows:

$$Iz=T.\alpha.AidB/Rampli$$

T: absolute temperature in Kelvin a: constant, independent form temperature and manufacturing method Rampli: value of the degeneration resistance of amplifier 60.

Iy, as will be more particularly shown hereafter, can be expressed as:

$$Iy=2.I1.VCT/Vo.Ro/Rp=2.K1.T/Rs.VCT/Vo.Ro/Rp$$

Further, to make gain control flexible, generally a current Ioffset is added to or subtracted from Iy. This current Ioffset is also PTAT and can be expressed by:

$$Ioffset=K2.t/Roffset$$

With:

K2: constant

T: absolute temperature in Kelvin

Roffset: resistance integrated on silicon

The difference Iy–Iz is then used as an error value which is transmitted to an error amplifier 50, which generates currents IA and IB in order to reduce value Iy–Iz down to zero. In an embodiment, error amplifier 50 generates currents IA, IB and also current IA+IB which flows through the third transistor 93.

A differential control loop for controlling the attenuation factor of the attenuation cell is thus obtained. No mathematical approximation is computed and it can be noted that the control loop ensures a high degree of accuracy of gain control. The control carried out by error amplifier 50 makes it possible to precisely compensate for the phenomena of temperature dependence of the junctions of diodes 91–93.

Linear control of the attenuation factor, in decibels, of the attenuation cell results, which control is largely independent of the temperature and characteristics dispersion, as shown in the formula:

$$Ai(dB)=2.K1/\alpha.Rampli/Rs.VCT/Vo.Ro/Rp\pm2.K2/\alpha.Rampli/Roffset \quad (3)$$

Thanks to the control which is carried out, an expression of gain Ai (dB) is obtained which does not depend any more on temperature, but only on a ratio of values of the same nature, which ensures an excellent precision according to the manufacturing method and temperature. Attenuation is controlled by a simple equation, the slope of which can easily be controlled (with VCT), and the origin ordinate of which can also be chosen, thanks to control current Ioffset.

Insensitivity to temperature that is obtained through generation of a desired value proportional to the absolute temperature makes it possible to reach a precision higher than 1 dB for a range of temperatures of 125 degrees.

Using current to carry out controls makes it possible to reach a better precision of realization, since the assembly will not be very sensitive to voltage drops due to spurious silicon routing resistances.

Figure 4:
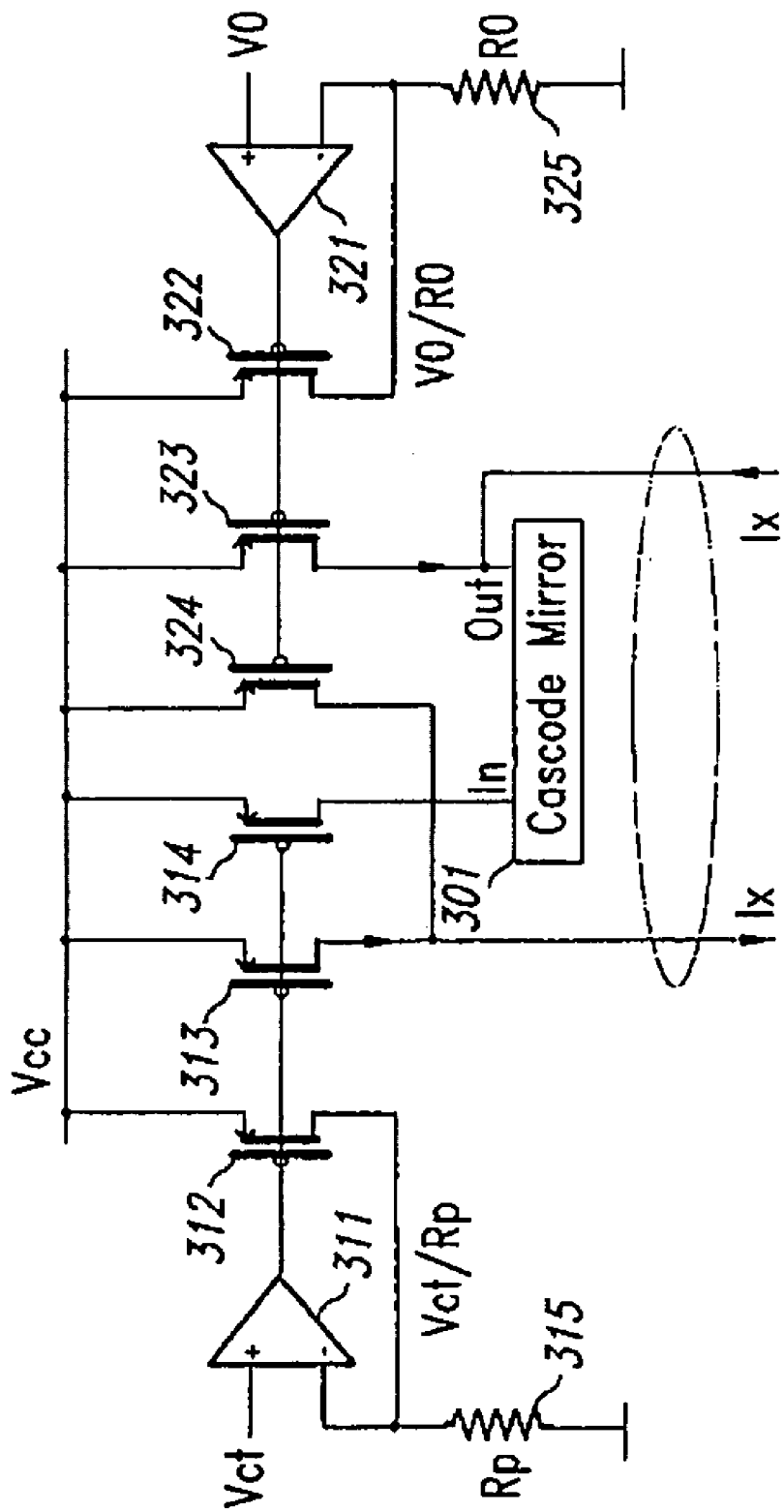
FIG. 4 illustrates one embodiment of the converter circuit 30 of the gain control device according to the invention.

FIG. 4 illustrates an embodiment of voltage-current converter circuit 30. The circuit comprises two amplifiers 311 and 321 each having a non-inverting input connected to a desired voltage Vct and a reference voltage $V_0$, respectively. Amplifiers 311 and 321 each have an inverting input that is connected to ground via a resistor, Rp and R0 respectively. Each further comprises an output electrode, which is connected to the gate of a set of three MOS transistors, 312-313-314 and 324-323-322, respectively. The source electrode of all the transistors is connected to positive voltage Vcc.

Transistor 312 (resp. 322) has a drain that is connected to the inverting input of amplifier 311 (resp. 321). The drain of transistor 313 is connected to the drain of transistor 324 and to a first output electrode of converter circuit 30. The drain of transistor 314 is connected to an input of a cascode mirror circuit 301, an output of which is connected to the drain of transistor 323 and to a second output electrode of converter circuit 30.

Circuit 30 operates as follows: the combination MOS transistor 312 and amplifier 311 makes it possible to generate a current $V_{ct}/R_p$ that flows through transistor 313 (assembled as a current mirror transistor compared to transistor 312).

Similarly, the combination of MOS transistor 322 and amplifier 321 generates a current $V_0/R_0$ flowing in transistor 323. Transistor 324, assembled as a current mirror too, makes it possible to generate a copy of this current $V_0/R_0$ that is added to current $V_{ct}/R_p$.

The output electrodes of circuit 30 thus see a current $V_0/R_0+V_{ct}/R_p$ and $V_0/R_0-V_{ct}/R_p$ respectively.

Thus, current differential conversion is realized. It is observed that current generation is desirably carried out with a high degree of accuracy. To this end, resistors will have precise values and MOS transistors will be large surface transistors in order to reduce offsets. Similarly, offset voltages of amplifiers 311 and 321 will be reduced. Lastly, for voltage $V_0$, a reference voltage independent of the temperature will be chosen, which could be carried out by means of a gap band type reference.

Figure 5:
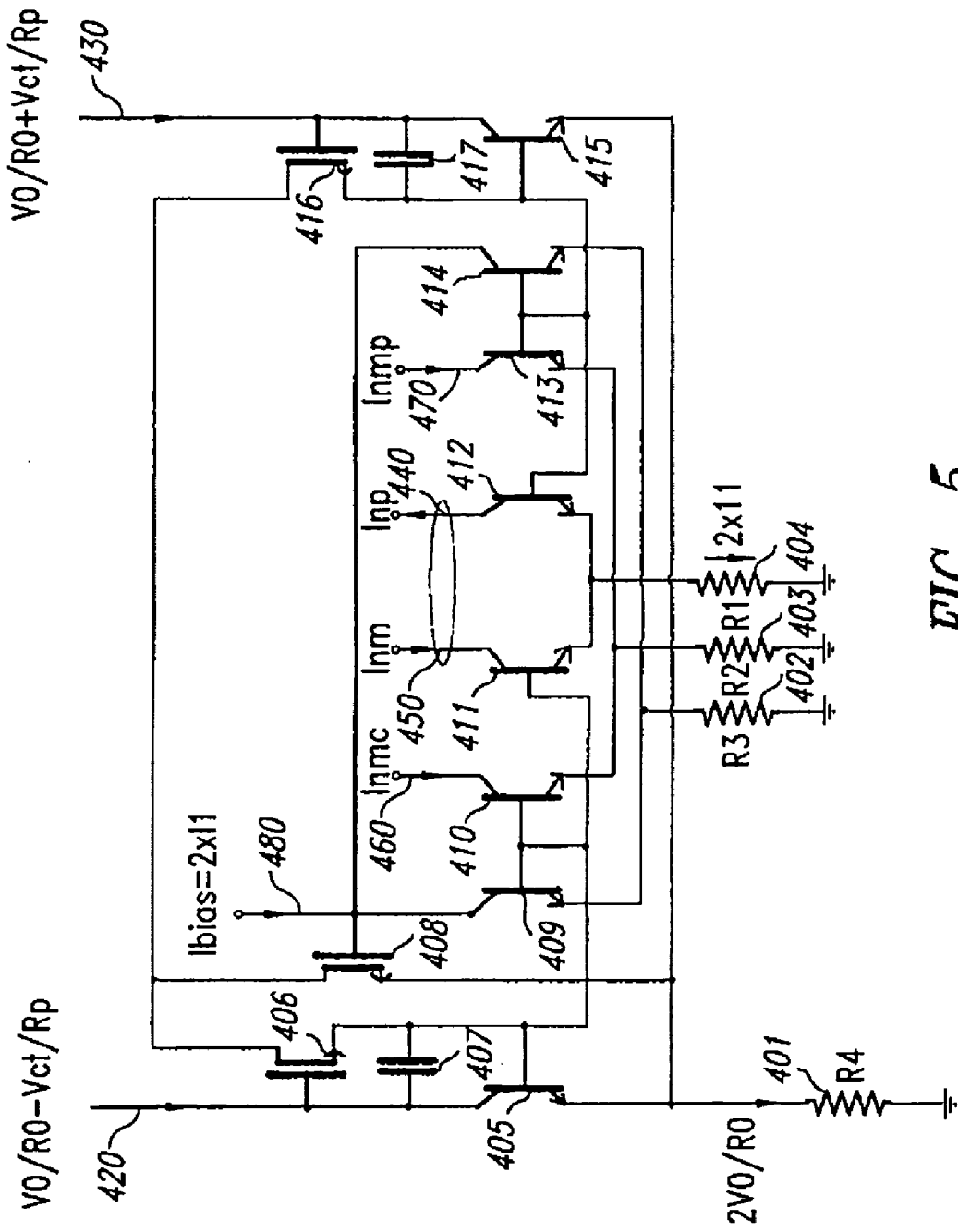
FIG. 5 illustrates one embodiment of the analog multiplier 40 of the gain control device according to the invention.

FIG. 5 illustrates an embodiment of analog multiplier 40.

The multiplier comprises two input transistors 415 and 405 whose collector electrodes receive currents $V_0/R_0+V_{ct}/R_p$ and $V_0/R_0-V_{ct}/R_p$ generated at the output of converter 30, respectively. The transmitter electrode of both transistors 415 and 405 is connected to ground via a resistor R4 401.

Multiplier 40 further comprises two output transistors 411 and 412 seeing respectively a current Inm and a current Inp transmitted to one of the output electrodes of the multiplier, respectively 450 and 440, via the collector electrode. The transmitter of each transistor 411 and 412 is connected to a resistor R1 404 whose other electrode is connected to ground.

The multiplier further comprises two transistors 410 and 413 seeing a recopy current Inmc and Inmp, respectively, and having a common mode transmitter electrode connected to ground via the same resistor R2 403.

Two buffer type MOS transistors 406 and 416 have a gate connected to electrodes 420 and 430, respectively, and their drain electrodes are connected together. The source of transistor 406 is connected to the bases of transistors 405, 409, 410 and 411 while the source of transistor 416 is connected to the bases of transistors 412, 413, 414 and 415. Two capacitors 407 and 417, respectively connected between the gate and source of transistors 406 and 416 are used to stabilize the operation of these transistors.

A MOS transistor 408 has a gate connected to electrode 480 receiving a reference current Ibias, and a drain connected to the common mode drains of transistors 406 and 416. Its source is connected to resistor 401.

The group of transistors 408, 409, 414 and 402 ensures polarization of all the transistors 405, 410, 411, 412, 413 and 415 by authorizing a low voltage on the transmitters of transistors 405, 409, 410, 411, 412, 413, 414 and 417, typically 100 mV. Had there been a power source instead of transistors 402, 403 and 304, it would then have been necessary to have at least approximately 400 mV. As can be seen, at low voltage (2.5 Volts minimum), this circuit allows stacking of function 50 above function 40.

The operation of analog multiplier 40 is as follows:

Considering the translinear loop made up of 405-411-412-415, it is possible to write:

$$(Vo/Ro-VCT/Rp).Inp=(Vo/Ro+VCT/Rp).Inm$$

By developing, one obtains:

$$Inm=I_1.(1-x\ Ro/Rp)$$

and $$Inp=I_1.(1+x.Ro/Rp)$$

with x=VctNo.

As Iy=Inp−Inm, one obtains: Iy=2.I1.VCT/Rp.Ro/Vo

A current that is set equal to 2× $I_1$ flows through resistor R1 404.

$I_1$ is a PTAT current realized by a conventional circuit. It is thus noted that absolute value Vct/V0 can be transformed into a value ptat $I_1$.

At the output of analog multiplier 40, a differential current Iy=Inp−Inm directly proportional to the absolute temperature T is obtained.

This current can then be directly used in the negative feedback loop of FIG. 3 to generate the error Iy−Iz used by error amplifier 50.

In an embodiment, the error amplifier 50 is used to generate currents IA, IB and IA+IB which flow through diodes 91, 92 and 93.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The above description of illustrated embodiments, including what is described in the Abstract, is not intended to be exhaustive or to limit the invention to the precise forms disclosed. While specific embodiments and examples are described herein for illustrative purposes, various equivalent modifications are possible within the scope of the invention and can be made without deviating from the spirit and scope of the invention.

These and other modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An attenuation cell having an attenuation factor control device with first and second input electrodes and first and second output electrodes, the attenuation cell comprising:
   a first differential pair having a first bipolar transistor and a second bipolar transistor, said first and second transistors each having a transmitter electrode connected to a first power source and to said first input electrode, said first transistor having a collector connected to said first output electrode;
   a second differential pair having a third bipolar transistor and a fourth bipolar transistor, said third and fourth bipolar transistors each having a transmitter electrode connected to a second power source and to said second input electrode, said fourth transistor having a collector connected to said second output electrode;
   said first and fourth bipolar transistors having a base that is connected to a same voltage VA and said second and third bipolar transistors having a base connected to a same voltage VB; and
   an attenuation factor control circuit for setting voltages VA and VB respectively, including:
      a first diode seeing a current IA so as to generate a voltage difference controlling said voltage VA;
      a second diode seeing a current IB so as to generate a voltage difference controlling said voltage VB;
      a third diode seeing a sum IA+IB of the currents flowing through said first and second diodes, said sum being generated by a third power source so as to generate a voltage difference VC corresponding to the sum of currents IA+IB;
      an amplifier having two inputs connected to receive voltages VB and VC generated by said second and said third diode respectively, said amplifier generating information Iz representative of a difference between the voltages VB and VC;
      a converter circuit receiving a desired value Vct varying linearly and generating a first value Ix;
      a multiplier circuit receiving said first intermediate value and generating a second value Iy proportional to said desired voltage Vct and to an absolute temperature T; and
      an error amplifier receiving error Iy−Iz as an input and generating currents IA and IB in order to minimize said error.

2. An attenuation cell according to claim 1 wherein said first and second values (Ix, Iy) and said information Iz generated by the amplifier receiving said voltages VB and VC are currents, said error amplifier being a current amplifier.

3. An attenuation cell according to claim 2, further comprising voltage trackers making it possible to respectively transmit voltages VA and VB to the bases of transistors of said attenuation cell.

4. An attenuation cell according to claim 2 wherein the converter circuit comprises:
a first amplifier and a second amplifier each having a non-inverting input, an inverting input and an output;
said non inverting inputs of said first and second amplifiers being connected to the voltage Vct and a reference voltage $V_0$ respectively;
said inverting inputs of said first and second amplifiers being connected to ground via resistors Rp and R0, respectively;
a first MOS transistor having a gate electrode, a source electrode and a drain electrode, said source electrode being connected to a positive voltage, said gate electrode being connected to the output of said first amplifier and said drain electrode being connected to the inverting input of said first amplifier;
a second transistor MOS having a gate electrode, a source electrode and a drain electrode, said source electrode being connected to the positive voltage, said gate electrode being connected to the output of said first amplifier, and said drain electrode being connected to a first output of the converter circuit;
a third MOS transistor having a gate electrode, a source electrode and a drain electrode, said source electrode being connected to the positive voltage, said gate electrode being connected to the output of said first amplifier, and said drain electrode being connected to an input of a cascode mirror circuit;
a fourth MOS transistor having a gate electrode, a source electrode and a drain electrode, said source electrode being connected to the positive voltage, said gate electrode being connected to the output of said second amplifier, and said drain electrode being connected to the inverting input of said second amplifier;
a fifth MOS transistor having a gate electrode, a source electrode and a drain electrode, said source electrode being connected to the positive voltage, said gate electrode being connected to the output of said second amplifier, and said drain electrode being connected to an output of said cascode mirror circuit and to a second output of the converter circuit; and
a sixth MOS transistor having a gate electrode, a source electrode and a drain electrode, said source electrode being connected to the positive voltage, said gate electrode being connected to the output of said second amplifier, and said drain electrode being connected to the drain electrode of said second MOS transistor.

5. An attenuation cell according to claim 2 wherein the multiplier circuit comprises:
first and second input transistors having collector electrodes coupled to receive currents from output terminals of the converter circuit and having emitter electrodes coupled to ground via a first resistor;
first and second output transistors having collector electrodes, the first output transistor having a collector electrode coupled to a first terminal of the multiplier circuit to carry a first current, the second output transistor having a collector electrode coupled to a second terminal of the multiplier circuit to carry a second current, both first and second output transistors having emitter electrodes coupled to ground via a second resistor;
first and second intermediate transistors having collector electrodes to respectively carry third and fourth currents and having emitter electrodes coupled to ground via a third resistor;
first and second buffer transistors having gate electrodes respectively coupled to the collector electrodes of the first and second input transistors and having drain electrodes coupled to each other;
wherein the first buffer transistor has a source electrode coupled to base electrodes of the first input transistor, the first output transistor, and the first intermediate transistor;
wherein the second buffer transistor has a source electrode coupled to base electrodes of the second input transistor, the second output transistor, and the second intermediate transistor;
first and second capacitors respectively coupled between the gate and source electrodes of the first and second buffer transistors; and
a MOS transistor having a gate electrode coupled to receive a bias current, a drain electrode coupled to the drain electrodes of the first and second buffer transistors, and a source electrode coupled to the first resistor.

6. An apparatus having an attenuation cell with first and second input electrodes and first and second output electrodes, the apparatus comprising:
a first differential pair having a first transistor and a second transistor, the first and second transistors each having a first terminal coupled to a first power source and to the first input electrode, the first transistor having a second terminal coupled to the first output electrode;
a second differential pair having a third transistor and a fourth transistor, the third and fourth transistors each having a first terminal coupled to a second power source and to the second input electrode, the fourth transistor having a second terminal coupled to the second output electrode;
the first and fourth transistors having third terminals coupled to a same voltage VA and the second and third transistors having third terminals coupled to a same voltage VB; and
an attenuation factor control circuit, coupled to the third terminals of the second and third transistors and to the third terminals of the first and fourth transistors, to set voltages VA and VB, the attenuation factor control circuit including:
a first diode element to carry a current IA so as to generate a voltage difference to control the voltage VA;
a second diode element to carry a current IB so as to generate a voltage difference to control the voltage VB;
a third diode element to carry a sum IA+IB of the currents flowing through the first and second diode elements, the sum being generated by a third power source so as to generate a voltage difference VC corresponding to the sum of currents IA+IB;
an amplifier having input terminals respectively coupled to the second and third diode elements to respectively receive the voltages VB and VC generated by the second and third diode elements, the amplifier being coupled to generate information Iz representative of a difference between the voltages VB and VC;
a converter circuit to receive a desired voltage Vct that varies linearly and to generate a first value Ix;
a multiplier circuit coupled to the converter circuit to receive the first value Ix and to generate a second value Iy proportional to the desired voltage Vct and to an absolute temperature T; and an error amplifier, coupled to the amplifier that generates the information Iz and to the multiplier circuit, to receive an error Iy−Iz as an input and to generate currents IA and IB in order to minimize the error.

7. The apparatus of claim 6 wherein the transistors of the first and second differential pairs include bipolar junction transistors.

8. The apparatus of claim 6 wherein at least one of the diode elements include diode-connected transistors.

9. The apparatus of claim 6 wherein Ix, Iy, and Iz comprise currents and wherein the error amplifier comprises a current amplifier.

10. The apparatus of claim 6, further comprising first and second voltage trackers having input and output terminals, the input terminal of the first voltage tracker being coupled to receive the voltage VA and having an output terminal coupled to the third terminals of the first and fourth transistors to provide the voltage VA thereto, the input terminal of the second voltage tracker being coupled to receive the voltage VB and having an output terminal coupled to the third terminals of the second and third transistors to provide the voltage VB thereto.

11. The apparatus of claim 6 wherein the converter circuit includes:
a first amplifier and a second amplifier, each having first, second, and third terminals;
the first terminals of the first and second amplifiers being coupled to the voltage Vct and to a reference voltage $V_0$ respectively;
resistors to respectively couple the second terminals of the first and second amplifiers to ground;
a first transistor having first, second, and third electrodes, the second electrode being coupled to a positive voltage, the first electrode being coupled to the third terminal of the first amplifier and the third electrode being coupled to the second terminal of the first amplifier;
a second transistor having first, second, and third electrodes, the second electrode being coupled to the positive voltage, the first electrode being coupled to the third terminal of the first amplifier and the third electrode being coupled to a first output terminal of the converter circuit;
a third transistor having first, second, and third electrodes, the second electrode being coupled to the positive voltage, the first electrode being coupled to the third terminal of the first amplifier and the third electrode being coupled to an input terminal of a mirror circuit;
a fourth transistor having first, second, and third electrodes, the second electrode being coupled to the positive voltage, the first electrode being coupled to the third terminal of the second amplifier and the third electrode being coupled to the second terminal of the second amplifier;
a fifth transistor having first, second, and third electrodes, the second electrode being coupled to the positive voltage, the third electrode being coupled to the third terminal of the second amplifier and the third electrode being coupled to an output terminal of the mirror circuit and to a second output terminal of the converter circuit; and
a sixth transistor having first, second, and third electrodes, the second electrode being coupled to the positive voltage, the third electrode being coupled to the third terminal of the second amplifier and the third electrode being coupled to the third electrode of the second transistor.

12. The apparatus of claim 6 wherein the multiplier circuit comprises:
first and second input transistors having first electrodes coupled to receive currents from output terminals of the converter circuit and having second electrodes coupled to ground via a first resistor;
first and second output transistors having first electrodes, the first output transistor having its first electrode coupled to a first terminal of the multiplier circuit to carry a first current, the second output transistor having its first electrode coupled to a second terminal of the multiplier circuit to carry a second current, both first and second output transistors having second electrodes coupled to ground via a second resistor;
first and second intermediate transistors having first electrodes to respectively carry third and fourth currents and having second electrodes coupled to ground via a third resistor;
first and second buffer transistors having first electrodes respectively coupled to the first electrodes of the first and second input transistors and having second electrodes coupled to each other;
wherein the first buffer transistor has a third electrode coupled to third electrodes of the first input transistor, the first output transistor, and the first intermediate transistor;
wherein the second buffer transistor has a third electrode coupled to third electrodes of the second input transistor, the second output transistor, and the second intermediate transistor;
first and second capacitors respectively coupled between the first and third electrodes of the first and second buffer transistors; and
another transistor having a first electrode coupled to receive a bias current, a second electrode coupled to the second electrodes of the first and second buffer transistors, and a third electrode coupled to the first resistor.

13. An apparatus having an attenuation cell with first and second input electrodes and first and second output electrodes, the apparatus comprising:
first and second differential pairs of transistors, the differential pairs respectively having first terminals coupled to the input electrodes and second terminals coupled to the output electrodes, a first transistor pair of each differential pair being coupled to a same voltage VA, a second transistor pair of each differential pair being coupled to a same voltage VB; and
an attenuation control circuit coupled to the first and second differential pairs of transistors to set the voltages VA and VB, wherein the attenuation control circuit includes:
a first diode element to carry a current IA so as to generate a voltage difference to control the voltage VA;
a second diode element to carry a current IB so as to generate a voltage difference to control the voltage VB;
a third diode element to carry a sum IA+IB of the currents flowing through the first and second diode elements to generate a voltage difference VC corresponding to the sum of currents IA+IB;
an amplifier having input terminals respectively coupled to the second and third diode elements to respectively receive the voltages VB and VC generated by the second and third diode elements, the amplifier being coupled to generate information Iz representative of a difference between the voltages VB and VC;
a converter circuit to receive a desired voltage Vct that varies linearly and to generate a first value Ix;

a multiplier circuit coupled to the converter circuit to receive the first value Ix and to generate a second value Iy proportional to the desired voltage Vct and to an absolute temperature T; and an error amplifier, coupled to the first amplifier that generates the information Iz and to the multiplier circuit, to receive an error Iy−Iz as an input and to generate currents IA and IB in order to minimize the error.

14. The apparatus of claim 13 wherein the wherein the converter circuit includes:

a first amplifier and a second amplifier, each having first, second, and third terminals;

the first terminals of the first and second amplifiers being coupled to the voltage Vct and to a reference voltage $V_o$ respectively;

resistors to respectively couple the second terminals of the first and second amplifiers to ground;

a first transistor having first, second, and third electrodes, the second electrode being coupled to a positive voltage, the first electrode being coupled to the third terminal of the first amplifier and the third electrode being coupled to the second terminal of the first amplifier;

a second transistor having first, second, and third electrodes, the second electrode being coupled to the positive voltage, the first electrode being coupled to the third terminal of the first amplifier and the third electrode being coupled to a first output terminal of the converter circuit;

a third transistor having first, second, and third electrodes, the second electrode being coupled to the positive voltage, the first electrode being coupled to the third terminal of the first amplifier and the third electrode being coupled to an input terminal of a mirror circuit;

a fourth transistor having first, second, and third electrodes, the second electrode being coupled to the positive voltage, the first electrode being coupled to the third terminal of the second amplifier and the third electrode being coupled to the second terminal of the second amplifier;

a fifth transistor having first, second, and third electrodes, the second electrode being coupled to the positive voltage, the first electrode being coupled to the third terminal of the second amplifier and the third electrode being coupled to an output terminal of the mirror circuit and to a second output terminal of the converter circuit; and a sixth transistor having first, second, and third electrodes, the second electrode being coupled to the positive voltage, the first electrode being coupled to the third terminal of the second amplifier and the third electrode being coupled to the third electrode of the second transistor.

15. The apparatus of claim 13 wherein the multiplier circuit comprises:

first and second input transistors having first electrodes coupled to receive currents from output terminals of the converter circuit and having second electrodes coupled to ground via a first resistor;

first and second output transistors having first electrodes, the first output transistor having its first electrode coupled to a first terminal of the multiplier circuit to carry a first current, the second output transistor having its first electrode coupled to a second terminal of the multiplier circuit to carry a second current, both first and second output transistors having second electrodes coupled to ground via a second resistor;

first and second intermediate transistors having first electrodes to respectively carry third and fourth currents and having second electrodes coupled to ground via a third resistor;

first and second buffer transistors having first electrodes respectively coupled to the first electrodes of the first and second input transistors and having second electrodes coupled to each other;

wherein the first buffer transistor has a third electrode coupled to third electrodes of the first input transistor, the first output transistor, and the first intermediate transistor;

wherein the second buffer transistor has a third electrode coupled to third electrodes of the second input transistor, the second output transistor, and the second intermediate transistor;

first and second capacitors respectively coupled between the first and third electrodes of the first and second buffer transistors; and another transistor having a first electrode coupled to receive a bias current, a second electrode coupled to the second electrodes of the first and second buffer transistors, and a third electrode coupled to the first resistor.

* * * * *